US010859615B2

(12) United States Patent  
Barabash et al.

(10) Patent No.: US 10,859,615 B2  
(45) Date of Patent: Dec. 8, 2020

(54) METHOD AND APPARATUS FOR VSWR ESTIMATION USING CROSS-CORRELATION AND REAL SAMPLING WITHOUT THE NEED FOR TIME ALIGNMENT

(71) Applicant: Nokia Solutions and Networks Oy, Espoo (FI)

(72) Inventors: Darrell Barabash, Grapevine, TX (US); Ramasamy Gopalan, Irving, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 417 days.

(21) Appl. No.: 15/135,823

(22) Filed: Apr. 22, 2016

(65) Prior Publication Data

US 2017/0310405 A1  Oct. 26, 2017

(51) Int. Cl.
*G01R 27/06* (2006.01)
*G01R 27/32* (2006.01)

(52) U.S. Cl.
CPC .............. *G01R 27/06* (2013.01); *G01R 27/32* (2013.01)

(58) Field of Classification Search
CPC ... H04W 24/00; H04B 17/345; H04B 17/336; H04B 17/103; H04B 17/101; H04B 1/0458; H04B 1/0483; H04B 1/0475; G01R 27/06; G01R 27/32
See application file for complete search history.

(56) References Cited

U.S. PATENT DOCUMENTS

| 7,194,365 B1* | 3/2007 | Sonntag | ............. | G01R 19/2509 |
| | | | | 324/76.15 |
| 8,687,734 B1* | 4/2014 | Chester | ............... | H04L 27/2614 |
| | | | | 370/208 |
| 2002/0054624 A1* | 5/2002 | Boloorian | ............ | H04B 1/7075 |
| | | | | 375/150 |

(Continued)

FOREIGN PATENT DOCUMENTS

WO   WO-2014/058432 A1   4/2014
WO   WO-2014/163640 A1   10/2014

*Primary Examiner* — Un C Cho
*Assistant Examiner* — Yu-Wen Chang
(74) *Attorney, Agent, or Firm* — Harrington & Smith

(57) ABSTRACT

Methods, apparatus, and computer program products using spectrum analysis or cross correlation techniques to discriminate against interference. These approaches are straight forward if both the forward and reflected signals contain complex or quadrature (I and Q) samples. But, if only single axis samples are available as is often the case to reduce the sampling rate, the resulting samples could represent the I component, the Q component or, more likely, some combination of the two. This generally requires some type of time alignment procedure to ensure proper phase. Assuming that the transmitted signal exists in complex form, this signal can be mathematically rotated in phase and then single axis sampled for comparison against the single axis reflected signal. If the rotation is done over equally spaced intervals that spans one complete cycle, the average of the absolute value all such return loss ratios will approach the actual return loss ratio and the interference will be suppressed. The resultant can be compared to a threshold value and trigger an alarm.

20 Claims, 7 Drawing Sheets

(56) References Cited

U.S. PATENT DOCUMENTS

| | | | |
|---|---|---|---|
| 2004/0066857 A1* | 4/2004 | Srinivasan | H04L 27/364 375/298 |
| 2004/0232919 A1* | 11/2004 | Lacey | G01R 31/11 324/533 |
| 2005/0203711 A1* | 9/2005 | Taylor | G01R 27/04 702/59 |
| 2006/0039322 A1* | 2/2006 | Furse | G01R 31/11 370/328 |
| 2007/0213947 A1* | 9/2007 | Jaklitsch | G01R 27/32 702/66 |
| 2009/0097579 A1* | 4/2009 | Yeon | H04L 25/03343 375/260 |
| 2009/0187362 A1 | 7/2009 | Salleh | |
| 2009/0281741 A1* | 11/2009 | van Zyl | G01R 19/0007 702/60 |
| 2010/0176789 A1* | 7/2010 | Zoughi | G01R 27/28 324/76.13 |
| 2010/0303140 A1* | 12/2010 | Tseng | H04B 17/336 375/227 |
| 2014/0210450 A1 | 7/2014 | Barabash et al. | |
| 2015/0288461 A1 | 10/2015 | Barabash et al. | |
| 2015/0295598 A1* | 10/2015 | Hellmann | H04B 17/103 370/242 |
| 2016/0020860 A1 | 1/2016 | Barabash et al. | |

* cited by examiner

| 402 | Measure values of a radio frequency signal that comprises a forward signal and a reflected version of the forward signal in a cable/connector system |

↓

| 404 | Input the measured values into a VSWR apparatus |

↓

| 406 | Mathematically rotate in phase, in the VSWR apparatus, a complex form of a transmitted signal |

↓

| 408 | Sample a single axis of the transmitted signal |

↓

| 410 | Compare the sample against a single axis reflected signal |

↓

| 412 | Apply the rotation over equally spaced intervals spanning one complete cycle |

↓

| 414 | Take an absolute value of each return loss ratio |

↓

| 416 | Determine the mean of the absolute values |

↓

| 418 | Associate the mean value with a return loss of the cable/connector system |

↓

| 420 | Send the mean value from the VSWR apparatus to an alarm actuator and activate the alarm based on the mean value in relation to a threshold |

METHOD AND APPARATUS FOR VSWR ESTIMATION USING CROSS-CORRELATION AND REAL SAMPLING WITHOUT THE NEED FOR TIME ALIGNMENT

TECHNICAL FIELD

This invention relates generally to wireless transmissions and, more specifically, relates to antenna usage in wireless transmissions.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below at the end of the specification but prior to the claims.

In a wireless transmission system, a transmitter is coupled to an antenna through a cable/connector system. Assuming an ideal transmission system, there will be no power reflected back from the load. That is, the transmission power in the "forward" signal is all applied through the cable/connector system to the antenna. Real transmission systems, however, have reflections due to, e.g., impedance mismatch somewhere in the cable/connector system or antenna.

Cellular operators need a way to monitor, in real-time, the condition of the antenna and its cable/connector system. A common indicator of this condition is the VSWR although there are many other equivalents including reflection coefficient and Return Loss. Return loss is the ratio of the forward (incident) and reflected powers, converted to dB. Most commonly, directional couplers, bridges or circulators are used to separate the two power signals (forward and reflected power signals) followed by detectors to quantify their respective amplitudes. While the forward signal tends to be quite pure, the reflected signal is returning from the antenna and may be accompanied by extraneous energy, which is "noise" insofar as the measurement is concerned.

This "noise" may be due to other transmitters electrically combined with the desired transceiver or from co-sited transmitters coupling in through the antennas. Either way, the reflected detector will report more power than the reflection itself is producing resulting in a lower return loss which may cause a false alarm. For example, recent advances in complex modulations with a significant time domain component, multiple carriers and especially co-siting can make the task of monitoring the condition of the antenna and its cable/connector system more difficult than in the past.

Multi-carrier/complex modulation schemes with traditional schemes suffer from problems. For example, for complex modulation and multiple carriers, typically, the log detectors used for this are not true power detectors (i.e., do not calculate true root-mean-squared power or measure heating in a load, or the like) so the result depends on the nature of the signal. For example, between a single CW carrier and a wideband CDMA or an LTE carrier (which resembles Gaussian noise), all at the same output power, the detector output could vary up to as much as approximately 5 dB. For example, the "noise" in the reflected signal may be due to other transmitters electrically combined with the desired transmitter or from co-sited transmitters coupling in through the antenna. Either way, a reflection detector will report more power than the reflection itself is producing, resulting in a lower return loss which may cause a false alarm. That is, since the return loss is a ratio of the forward and reflected powers, anything that erroneously increases the reported reflective power will decrease the return loss (assuming the forward power is stable), and an alarm can be reported due to the artificially reduced return loss.

It would be beneficial to improve the ability to monitor, in real-time, the condition of the antenna and its cable/connector system. Problems such as described above are tackled by the present invention as described in the following paragraphs

SUMMARY

This section contains examples of possible implementations which should not be construed as limiting the invention in any way.

An example of an embodiment is a method that comprises measuring values of a radio frequency signal that comprises a forward signal and a reflected version of the forward signal in a cable/connector system; inputting the measured values into a VSWR apparatus; mathematically rotate in phase, in the VSWR apparatus, a complex form of a transmitted signal; sampling a single axis of the transmitted signal; comparing the sample against a single axis reflected signal; applying the rotation over equally spaced intervals spanning one complete cycle; taking an absolute value of each return loss ratio; determining the mean of the absolute values; associating the mean value with a return loss of the cable/connector system; and sending the mean value from the VSWR apparatus to an alarm actuator and activating the alarm based on the mean value in relation to a threshold.

Another example of an embodiment is a computer program product comprising program code for executing the method according to the previous paragraph. A further example of an embodiment is the computer program according to this paragraph, wherein the computer program is a computer program product comprising a computer-readable medium bearing computer program code embodied therein for use with a computer.

An additional example of an embodiment is an apparatus comprising at least a memory and at least a processor. The memory could hold computer program code that is executed by the processor. The apparatus includes additional circuitry configured to perform at least the following: measuring values of a radio frequency signal that comprises a forward signal and a reflected version of the forward signal in a cable/connector system; inputting the measured values into a VSWR apparatus; mathematically rotate in phase, in the VSWR apparatus, a complex form of a transmitted signal; sampling a single axis of the transmitted signal; comparing the sample against a single axis reflected signal; applying the rotation over equally spaced intervals spanning one complete cycle; taking an absolute value of each return loss ratio; determining the mean of the absolute values; associating the mean value with a return loss of the cable/connector system; and sending the mean value from the VSWR apparatus to an alarm actuator and activating the alarm based on the mean value in relation to a threshold. The circuitry may comprise one or more processors. A further example of an embodiment is at least one integrated circuit comprising the apparatus of this paragraph. Another example of an embodiment is a base station comprising the apparatus of this paragraph.

Another example of an embodiment is an apparatus, comprising means for measuring values of a radio frequency signal that comprises a forward signal and a reflected version of the forward signal in a cable/connector system; means for inputting the measured values into a VSWR; means for mathematically rotate in phase, in the VSWR, a complex form of a transmitted signal; means for sampling a single axis of the transmitted signal; means for comparing the sample against a single axis reflected signal; means for applying the rotation over equally spaced intervals spanning one complete cycle; means for taking an absolute value of each return loss ratio; means for determining the mean of the absolute values; means for associating the mean value with a return loss of the cable/connector system; and means for sending the mean value from the VSWR apparatus to an alarm actuator and activating the alarm based on the mean value in relation to a threshold. A further example of an embodiment is at least one integrated circuit comprising the apparatus of this paragraph. Another example of an embodiment is a base station comprising the apparatus of this paragraph.

As yet another example of an embodiment, an apparatus is disclosed. The apparatus includes one or more processors, and one or more memories including computer program code. The one or more memories and the computer program code are configured, with the one or more processors, to cause the apparatus to perform or control at least the following: measuring values of a radio frequency signal that comprises a forward signal and a reflected version of the forward signal in a cable/connector system; inputting the measured values into a VSWR apparatus; mathematically rotate in phase, in the VSWR apparatus, a complex form of a transmitted signal; sampling a single axis of the transmitted signal; comparing the sample against a single axis reflected signal; applying the rotation over equally spaced intervals spanning one complete cycle; taking an absolute value of each return loss ratio; determining the mean of the absolute values; associating the mean value with a return loss of the cable/connector system; and sending the mean value from the VSWR apparatus to an alarm actuator and activating the alarm based on the mean value in relation to a threshold.

BRIEF DESCRIPTION OF THE DRAWINGS

In the attached Drawing Figures:

FIG. 4 is a block diagram of an example of a logic flow diagram that illustrates the operation of an example of a method, a result of execution of computer program instructions embodied on a computer readable memory, and/or functions performed by logic implemented in hardware, in accordance with exemplary embodiments of this invention;

DETAILED DESCRIPTION OF THE DRAWINGS

As noted above, cellular operators need a way to monitor, in real time, the condition of the antenna and its cable/connector system. The most common indicator of this quality is the VSWR or, equivalently, the return loss. Interference present in co-siting or shared antenna installations makes the determination difficult and subject to false alarms. Mitigation methods have been disclosed that use spectrum analysis or cross correlation techniques to discriminate against interference. These approaches are straight forward if both the forward and reflected signals contain complex or quadrature (I and Q) samples. However, if only single axis samples are available, as is often the case to reduce the sampling rate, then the resulting samples could represent the I component, the Q component or, more likely, some combination of the two. This generally requires some type of time alignment procedure to ensure proper phase. It can be difficult and unreliable in the presence of interference.

This invention teaches a method of obtaining a VSWR estimation using cross-correlation or spectrum analysis techniques with single axis sampling but without the need of strict time alignment. It assumes that the transmitted signal exists in complex form and that this signal can be mathematically rotated in phase and then single axis sampled for comparison against the single axis reflected signal. If the rotation is done over equally spaced intervals that spans one complete cycle, the average of the absolute value all such comparisons will approach the actual return loss value and the interference will be suppressed.

Figure 1:
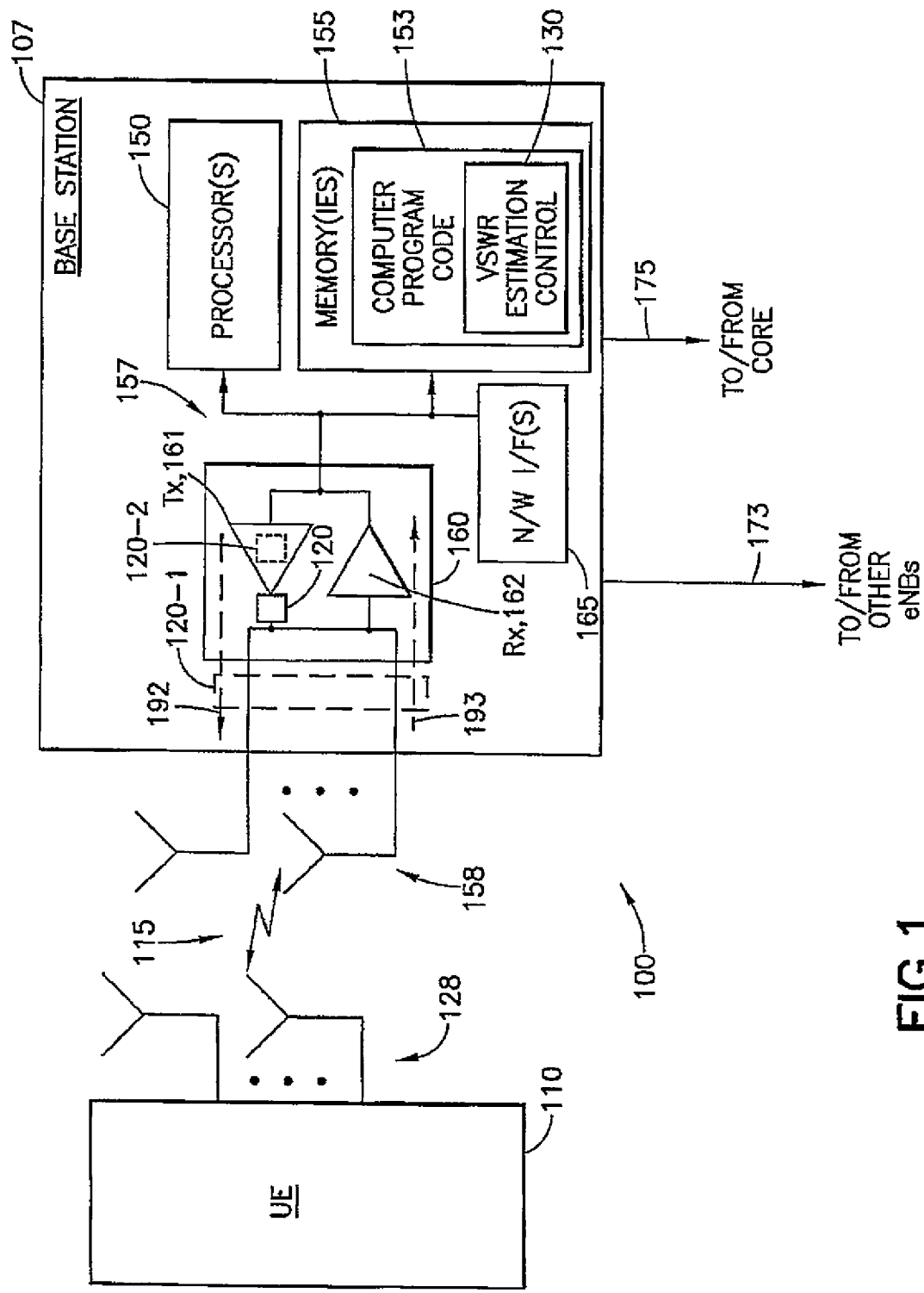
FIG. 1 illustrates an example of a system in which the exemplary embodiments of the instant invention may be practiced.

Before proceeding with description of additional problems with conventional systems and how exemplary embodiments address these problems, reference is now made to FIG. 1, which illustrates an example of a system in which the exemplary embodiments of the instant invention may be practiced. In FIG. 1, a user equipment (UE) 110 is in wireless communication with a wireless network 100 via a wireless link 115 with base station 107 (such as an eNB or NodeB), which is an LTE base station (in this example) providing access to and from the wireless network 100. The user equipment 110 includes one or more antennas 128.

The network 100 includes the base station 107. Although an LTE base station is used herein as an example, the exemplary embodiments are applicable to any wireless transmission system. The base station 107 includes one or more processors 150, one or more memories 155, one or more network interfaces (N/W I/F(s)) 165, and one or more transceivers 160 (each comprising a transmitter, Tx, 161 and a receiver, Rx, 162) interconnected through one or more buses 157. In the transmitter 161, a VSWR estimation apparatus 120 is used to perform VSWR estimation in accordance with exemplary embodiments of the instant invention. The location, as indicated by reference 120, of the VSWR estimation apparatus is merely an example. Portions 120-1 of the VSWR estimation apparatus 120 may be included after the Rx and Tx antenna paths are combined (as shown by reference 120-1), or portions 120-2 may be implemented in the transmitter 161. There are multiple locations in a transmission path 192 (and also in part of the reception path 193) where some or all of the VSWR estimation apparatus 120 may reside. The one or more transceivers 160 are connected to one or more antennas 158. The one or more memories 155 include computer program code 153, which in this example comprises VSWR estimation control functionality 130, which may partially or completely perform and/or control VSWR estimation. The one or more memories 155 and the computer program code 153 are configured to, with the one or more processors 150, cause the base station 107 to perform one or more of the operations as described herein. The VSWR estimation control functionality 130 may be implemented in the computer program code 153 (executed by the one or more processors 150), or implemented in hardware such as logic in an integrated circuit as described below, or as some combination of computer program code and hardware.

The one or more network interfaces 165 communicate over networks such as the networks 173, 175. The base station 107 may communicate with other base stations using, e.g., network 173. The network 173 may be wired or wireless or both and may implement, e.g., an X2 interface. The base station 107 may use the network 175 to communicate with a core portion of the wireless network 100.

The computer readable memory 155 may be of any type suitable to the local technical environment and may be implemented using any suitable data storage technology, such as semiconductor based memory devices, flash memory, magnetic memory devices and systems, optical memory devices and systems, fixed memory and removable memory. The processor(s) 150 may be of any type suitable to the local technical environment, and may include one or more of general purpose computers, special purpose computers, general or special purpose integrated circuits, microprocessors, digital signal processors (DSPs) and processors based on a multi-core processor architecture, as non-limiting examples.

Figure 2:
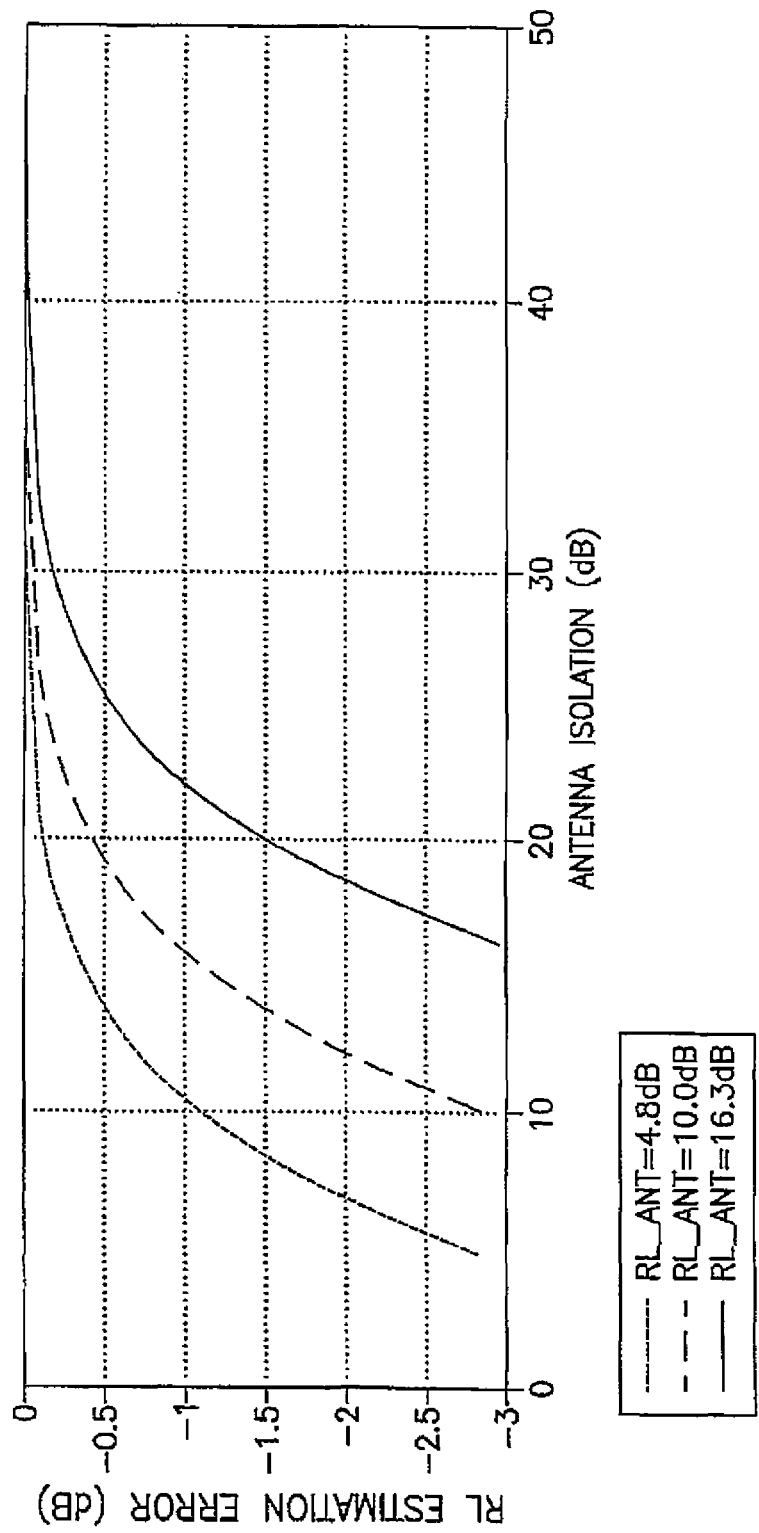
FIG. 2 is a chart of measurement error versus isolation.

As stated above, there could be noise in a reflected signal that causes a reflection detector to report more power than the reflection itself is producing, resulting in a lower return loss which may cause a false alarm. In order to obtain adequate accuracy, it is generally necessary to suppress the interfering signals by roughly 25 dB or more. But, depending on the tolerable error (see the RL, Return Loss, Estimation Error), the isolation could be more or less as shown in FIG. 2. The "RL_ANT" are return losses of the antenna system. The required isolation is usually obtained through some combination of power level restrictions, isolators, directional couplers/splitters and/or antenna placement. The exemplary embodiments disclosed herein are capable of minimizing or even eliminating the means normally taken to maintain adequate isolation. For instance, exemplary techniques disclosed herein provide discrimination between the reflections of the signal that are emanating from the desired transmitter versus interference that couples in from other sources (e.g., another transmitter co-sited with the transmitter TX 161 that transmits the original signal and receives the reflected signal).

Nonetheless, the circuitry in FIG. 1 would be further configured to perform determining an alarm should occur based on the return loss and outputting an indication of the alarm. Such indication could be sent externally by one or more antennas 158, via the networks 173, 175, or connected to an alarm (not shown) internally in base station 107 or through the one or more antennas 158, via the networks 173, 175, or via other circuitry (not shown).

A method was disclosed previously in Barabash et al, "VSWR Estimation Using Cross-correlation to Suppress External Interference", PCT application WO 2014/058432, filed on 12 Oct. 2012, which uses cross correlation to discriminate against interference. However, such cross-correlation as discussed therein needs an accurate time alignment to find a fault in the condition of an antenna and its cable/connector system. Then, the cross-correlation calculations are straight forward if both the forward and reflected signals contain complex or quadrature (I and Q) samples. However, if only single axis samples (either I or Q) are available, the problem is more difficult. Specifically, depending on the phase of the sampler, the resulting samples could represent the I component, the Q component, or, more likely, a combination of the two. This real sampling approach is often used to reduce the sampling rate by 2× but it then requires some type of time alignment procedure to ensure proper phase and can be difficult in the presence of interference.

In contrast, the current invention presents a more efficient way to detect a problem in the condition of an antenna and its cable/connector system. The current invention presets a method of obtaining a VSWR estimation using cross-correlation or spectrum analysis techniques with single axis sampling but without the need of strict time alignment. It assumes that the transmitted signal exists in complex form and that this signal can be mathematically rotated in phase and then single axis sampled for comparison against the single axis reflected signal. If the rotation is done over equally spaced intervals that spans one complete cycle, the average of the absolute value all such return loss ratios will approach the actual return loss ratio and the interference will be suppressed By way of a brief and non-limiting introduction, in exemplary embodiments a forward signal is transmitted and a reflected signal occurs due to properties of the cable/connector system and such exemplary embodiments, presented herein, teach a method of obtaining a VSWR estimation using cross-correlation techniques with real sampling but without the restriction of strict time alignment.

Prior to computing the cross correlation, a technique must be employed to time align the real sampler phase so that the results purely represent the I (or Q) component. Then, the reflected samples can be correlated against the I (or Q) component of the forward signal in order to estimate the return loss.

These techniques typically involve either a priori knowledge of the phase offset or use some adaptive technique to align the phase such that the error between the forward signal and the reflected signal are minimized. The latter is very often necessary for Digital Adaptive Pre-Distortion (DAPD) and could potentially be used for this cross-correlation calculation.

In DAPD, the signals present are only those that are desired and their (low level) intermodulation products thus the resulting time alignment can be quite accurate and robust. However, for a return loss estimator, the reflected signal can be buried in noise and interfering signals reducing the confidence of the result. In fact, in the case of significant interference, the minimization (or maximization) of the time alignment metric may be completely fooled and erroneous. This could significantly skew a mean estimation thus some intelligence would be required to throw out results that are below some minimum confidence level. The decision of what to keep and what to throw out can be very difficult to arrive at and will be a compromise between measurement confidence and time required to render an estimate. In fact, with large, sustained interference a measurement may never be rendered if the criteria are not optimal.

An example of a technique disclosed herein completely eliminates the need for time alignment and eliminates the need to make hard decisions related to confidence of said result. This new approach is more predictable, much simpler to design and implement, and is overall a more robust solution suited especially to measurements where interference dominates the desired signal.

Additional advantages of the approach disclosed herein over a time-alignment method is that the latter involves finding time delay prior to estimating VSWR/RL while the current approach does not need time alignment in order to estimate VSWR/RL. To find time delay apriori in a time-alignment method, cross-correlation needs to be performed which can fall apart completely in the presence of in-band or co-channel interferer that has high power (such as for a requirement of ~20 dB of reflected signal-interferer rejection ratio). This is due to the fact that time alignment via delay search as performed in DAPD is always in a benign environment with a high Signal-Interference ratio. Moreover, in a time-alignment method, the distance of the fault is unknown; it may vary from OPEN to 100 m, translating to 2 ns to 2 μs in time. In order for time alignment to work, there is a need to perform cross-correlation every time for VSWR unlike DAPD, where it is done only once during initialization of the base station. After time alignment, there is also a need to implement a System Identification algorithm (essentially an N-tap FIR filter) to estimate VSWR/RL value. This will also take time depending on the size of the taps. Plus, if the System Identification matrix turns out to be singular, VSWR/RL would be unobtainable even though we manage to obtain the right time alignment. Thus a time-alignment method requires more computation time in case of high co-channel interferer than the current method and a time-alignment method would not work well when high co-channel interferer is present.

Such embodiments as described here can provide Time-To-Fault information and provide information about the nature of the fault such as the case if the fault is deemed OPEN/SHORT/capacitive/inductive based on the phase of the sine wave obtained from the invention as disclosed herein. This capability is in a sense a built-in TDR (Time Domain Reflectometer) inside a Base Station or other instrumentation utilizing this disclosed invention.

Figure 3A:
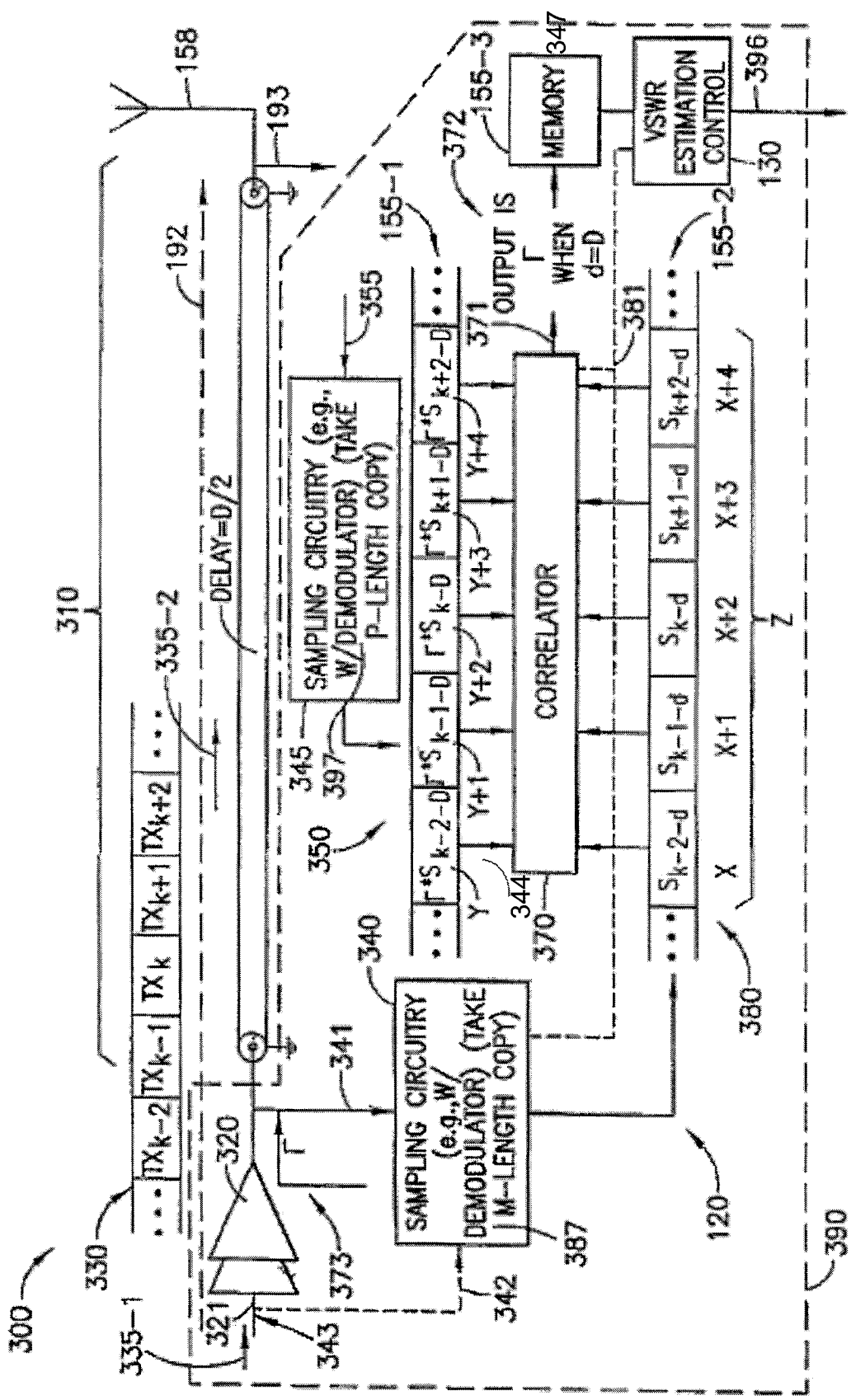
FIG. 3A is a block diagram of a portion of a transmitter including (a portion of) an example of a VSWR apparatus.

Furthermore, thresholds could be established above which would give different indications of fault and would yield different alarm thresholds. The current invention makes use of the PDRX (Pre-Distortion Receiver) that likely already exists to serve the power amplifier pre-distortion function. By way of a switch, it can be used to monitor the signal being transmitted and the reflected signal. This is not essential but does eliminate the need for a dedicated receiver. The reflected signal is typically delayed due to the propagation time to and from the location of the dominant reflection and time is proportional to the distance. Correlation of the reflected signal against the transmitted signal yields the reflection coefficient as a function of time. But, since this result contains noise due to thermal effects as well as the modulation on the signal itself, a low pass filter is used to smooth the measurement. As will be discussed in detail below, complex rotation of transmitted signal in discrete steps from $-\pi/2$ to $\pi/2$ and then correlation with the reflected signal can provide the cross-correlation result without needing time alignment Additional detail for certain exemplary embodiments is provided by reference to FIGS. 3A, 3B, 4, 5, and 6. Turning to FIG. 3A, a block diagram is shown of a portion 300 of a transmitter 161, including an example of a VSWR apparatus 120 (although the VSWR apparatus 120 may also be separate from the transmitter 161). It should be noted that FIG. 3A, fob simplicity, concentrates on the transmission path and does not show the reception path (see FIG. 1 from the antenna(s) 158 to the receiver, Rx, 162). However, this not to be construed as limiting. The portion 300 includes one or more power amplifiers 320. The power amplifiers are coupled to a cable/connector system 310, which is coupled to the antenna 158. The delay caused by the cable/connector system 310 is D/2 in this simple example. The VSWR apparatus 120 includes in this example sampling circuitries 340 and 345, buffers 155-1 and 155-2, memory 155-3, a correlator 370, and VSWR estimation control functionality 130. In this example, the one or more power amplifiers 320 and the VSWR estimation apparatus 120 are implemented in an integrated circuit (IC) 390, such as an application-specific integrated circuit(s) (ASIC). The VSWR estimation control functionality 130 therefore may be implemented as logic in the IC 390. However, some or all of the VSWR estimation control functionality 130 may be implemented in computer program code 153 (e.g., stored as firmware/software in memory 155, see FIG. 1) and executed by a processor 150, e.g., formed as part of the IC 390 or separate from the IC 390.

It should be noted that although only one ASIC is shown, there may be multiple ASICs or other hardware elements. For instance, the sampling circuitry 340 could be implemented by one ASIC, the sampling circuitry 345 could be implemented by another ASIC, and the one or more memories 155, correlator 370, and VSWR estimation control 130 implemented by a third ASIC. Gate arrays or other programmed devices may also be used. Furthermore, aspects of the embodiments may be performed by hardware, software (executed by hardware), or some combination. This is really an implementation detail, trading off items like cost, space, VSWR reporting speed, and the like, but the general approaches herein are independent of this.

The operation of the portion 300 of the transmitter 161 and of the VSWR apparatus 120 is described in relation to FIG. 3A and also in relation to FIG. 4. FIG. 4 is a block diagram of an example of a logic flow diagram that illustrates the operation of an example of a method, a result of execution of computer program instructions embodied on a computer readable memory, and/or functions performed by logic implemented in hardware, in accordance with exemplary embodiments of this invention.

In an example of an embodiment of the instant invention, rather than using individual forward and reflected signal power detectors, a sampled version (e.g., set 380 of samples) of the composite transmitted signal waveform 330 is correlated with a sampled and delayed version (e.g., set 350 of samples) of the reflected signal waveform. The delay, d, is varied from, in an example of an embodiment, zero to the longest delay (e.g., dMax) expected (2×ANT_cable_length/ velocity_of_propagation) which is on the order of 1.5 μsec (microseconds) for a typical base station site where ANT_cable_length is the antenna cable length and velocity_of_ propagation is the velocity of propagation in the cable where only the cable/connector system is considered 310. However, as described below, this is merely an example and the longest delay may be dramatically different from the formula just presented. A forward signal is aligned with a reflected signal. For each delay, the correlation is calculated and the maximum value found is converted to dB. It represents the best estimate of the return loss and the delay represents the time and therefore the distance to the reflection. Any component of the reflected signal that is not just a scaled version of the transmitted signal does not contribute to the correlation and is thus suppressed.

The example of FIG. 3A uses a sampling point 341 for at least the sampling of the forward signal. Thus, the indicated delay, D, is for the cable/connector system 310. However, this is merely an example, and the sampling of at least the forward signal 335 could occur at many different locations in the transmission path 192, e.g., at location 342, prior to the one or more power amplifiers 320 and as such can occur in the baseband 343. This is indicated by reference 335-1, which is a baseband version of the forward signal 335 that is transmitted. For this example, the sampling occurs without use of the demodulator 387. In this case, the transmission path 192 can start in the baseband 343 and conclude in the antenna(s) 158. Furthermore, in this case, the delay D can be quite large and include time delays for the power amplifier(s) 320, filters (not shown) if used, and other electronics.

In terms of using the example of a sampling point 341, a signal waveform on the input 321 is transmitted by the one or more power amplifiers 320. A version of the amplified radio frequency signal waveform is shown as 330, which includes many symbols (in this example), a portion of which is shown as " ... $TX_{k-2}$, $TX_{k-1}$, $TX_k$, $TX_{k+1}$, $TX_{k+2}$ ... ", and a radio frequency version of the forward signal is illustrated by reference 335-2. The forward RF signal 335-2 is sampled at a particular sampling rate (e.g., in megasamples per second, Msps) by the sampling circuitry 340, where in one example the sampling occurs after demodulation by the demodulator 387. The set 380 of samples includes in this example M samples, a portion of which is shown as " ... $S_{k-2-d}$, $S_{k-1-d}$, $S_{k-d}$, $S_{k+1-d}$, $S_{k+2-d}$ ... ", where each S is a symbol corresponding to a symbol TX in the amplified waveform 330.

To compute the correlation, a fixed length (e.g., M-length) set 380 of samples of the transmitted forward RF signal 335-2 is taken and stored in, e.g., a temporary buffer 155-2. Then, after some defined delay from the start of this buffering operation, a sample by sample correlation against the reflected signal waveform is done (this can be accomplished, for example with the first of the M samples or some other reference point, where another fixed length, e.g., P-length, set 350 of samples of the reflected waveform 355 is taken by the sampling circuitry 345, which includes a demodulator 397 from which the samples 350 are generated and is stored in, e.g., another temporary buffer 155-1, although it should be noted the two buffers 155-1 and 155-2 could be a single large buffer).

The final result is stored, the delay incremented, and the measurement done again and repeatedly until the entire delay range has been covered. The set 350 of samples includes in this example P samples, a portion of which is shown as " ... $\Gamma S_{k-2-D}$, $\Gamma S_{k-1-D}$, $\Gamma S_{k-D}$, $\Gamma S_{k+1-D}$, $\Gamma S_{k+2-D}$ ... ", where $\Gamma$ is the reflection coefficient and each S is a symbol corresponding to a symbol TX in the amplified waveform 330. A maximum search of the results then yields the return loss estimate.

Figure 3B:
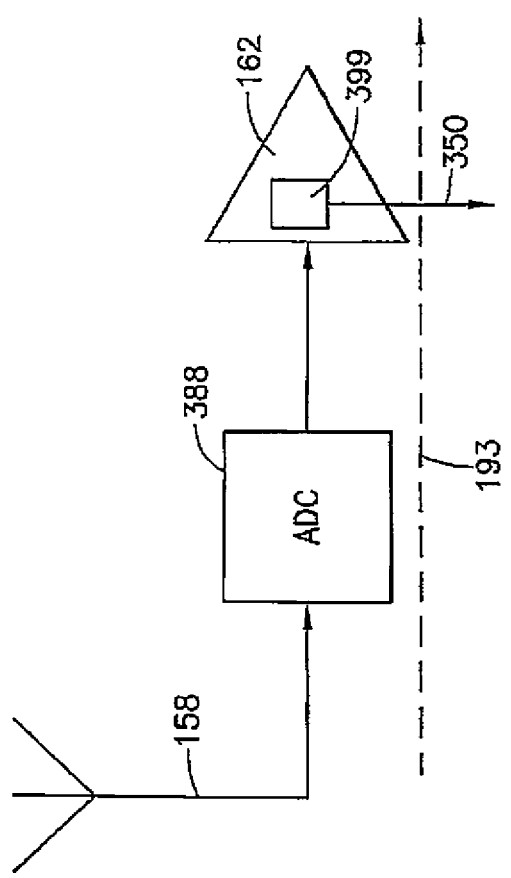
FIG. 3B is a block diagram of a portion of a reception path used as a portion of an example of a VSWR apparatus.

It is noted that the sampling circuitry 345 may occur before or after Rx and Tx paths are combined or at other locations in the Tx path. In particular, one possibility is shown in FIG. 3B, which shows a block diagram of a portion of a reception path 193 (also illustrated in FIG. 3A) used as a portion of an example of a VSWR apparatus. In this example the portion includes an ADC (analog-to-digital converter 388) and part of the receiver 162, including at least a demodulator 399, which produces the set 350 of samples. It is noted that typically P will be greater than or equal to M, although this is not a limitation.

The "receiver" ADC in this case must be on the same line as the TX is operating on. That is the reflection being observed. While it might be possible to use the main receiver, that would require switching it to the TX path and tuning it to the TX frequency. Practical implications are that in an FDD system RX and TX must be simultaneous.

A sample by sample correlation against the reflected signal waveform is performed by the correlator 370, which in an example is a set of logic operations implemented in the IC 390 (or may be performed by software executed by hardware, or both). In one example, the correlator 370 starts at one end of a "delay" range (e.g., delay=0) in (one possible) block 344 ("Start at delay=0") and the cross correlator 370 performs correlation between the forward waveform in the set 380 of samples and the reflected waveform in the set 350 of samples. Correlation may be defined as follows:

$$CC[k] = \sum_{d=0}^{d_{Max}} f^*[k]g[k-d],$$

The final result 371 is stored (the storage may be to memory 155-3), the delay, d, is modified (e.g., incremented), and the measurement performed again and repeatedly until the entire "delay" range (e.g., from d=0 to d=$d_{Max}$) has been covered. More particularly, it is determined if the delay is at the other end of the delay range (e.g., d=$d_{Max}$). If not, correlation is performed by the correlator 370 again. A maximum search of the results 371 stored in memory 155-3 then yields the return loss estimate.

The use of a delay and a delay range is one example, but since the memories 155-1 and 155-2 may be implemented using indices such as those used in circular buffers or other buffers, the calculations may be performed using indices instead (where an index can be converted to a delay). Furthermore, it will typically be the case that a number Z, of the M samples will be used to compare with a number Z of the P samples. FIG. 3A therefore also illustrates that a number Z of five (in this example, typically Z will be much higher, such as 128 or more samples) samples in the set 380 having indices X through X+4 are aligned with the number Z of five samples in the set 350 having indices Y through Y+4. A correlation is performed and the result is stored. The number, Z, of samples in the set 380 is slid across the samples in set 350. If a maximum index (for the samples in the set 350) is not reached, another correlation is performed. The correlation formula from before may be used, where f[k] is a number Z from the set 350 of samples, and g[k] is a number Z from the set 380 of samples, the f[k] is slid relative to g[k] for each correlation, and d is $Y_{Max}$-1. Each CC[k] has a set of Z correlation coefficient values, and there will be $d_{Max}$+1 (i.e., $Y_{Max}$) sets of results 371 in this example. Furthermore, since each index (X or Y) corresponds to a sample period, the indices corresponding to and can be converted to delays.

For instance a first correlation after alignment is performed using X to X+4 samples of the set 380 and Y to Y+4 samples of the set 350. The next correlation is performed using X to X+4 samples of the set 380 and Y+1 to Y+5 samples of the set 350 (i.e., the X to X+4 samples of the set 380 are slid to Y+1 to Y+5 samples of the set 350). The next correlation is performed using X to X+4 samples of the set 380 and Y+2 to Y+6 samples of the set 350 (i.e., the X to X+4 samples of the set 380 are slid to Y+2 to Y+6 samples of the set 350). This continues until the final correlation is performed using X to X+4 samples of the set 380 and $Y+Y_{Max-Z}$ to $Y+Y_{Max}$ samples of the set 350 (i.e., the X to X+4 samples of the set 380 are slid to $Y+Y_{Max-Z}$ to $Y+Y_{Max}$ samples of the set 350), where $Y_{Max}$ is the maximum index in the set 350. For instance, M and P could be 4096 (e.g., for a sample rate of 76.8 MHz), Z might be the first 128 samples (for instance), the alignment would start at both M, P=0, and end after the 128 samples have been slid by all of the 4096 samples in the P samples (e.g., $Y_{Max}$=4096−128−1).

The maximum value in the results 371 stored in 155-3 is determined, as is the delay corresponding to the maximum value. Determining the delay is optional. the maximum value is converted to dB (e.g., using dB=20 log(maximum value)). It is noted that the process of performing the correlation may be performed to also determine the correlation values in dB and therefore block 347 would find the maximum value in dB. The return loss estimate or an indication thereof (i.e., the maximum value in dB) is output as output 396, e.g., to one of the processors 150 (see FIG. 1). This may be used to determine whether an alarm is suitable and, if so, to output, if desired, an indication of the alarm. Alternatively or in addition, one or more function(s) may be performed in response to the alarm. It should also be noted that it is not necessary to only return the value of the peak value. Rather, the entire vector can be returned giving the reflection coefficient versus time (distance) for the entire system. In this way this algorithm provides the same sort of information as would be provided by a Time Domain Reflectometer (TDR).

It is noted that the examples above start at d=0 and end at d=$d_{Max}$. However, the reverse can be true, the starting point can be d=$d_{Max}$ and the ending point can be d=0. Furthermore, the set 380 of samples is delayed and the set 350 of samples is not in the examples. However, the opposite may also be true, the set 350 of samples may be delayed and the set 380 of samples may not be delayed. It is also noted that the sliding of the forward signal samples "across" the reflected signal samples is a "movement" of the forward signal samples relative to the reflected signal samples. That is, the reflected signal is effectively kept stationary while the forward signal is moved. In the example of FIG. 3A, this is done by increasing the Y index value relative to the number Z of samples in the set 380 of forward signal samples. However this could also be done by decreasing the Y index value relative to number Z of samples in the set 380 of forward signal samples. That is, X aligns with Y in the example above, then X aligns with Y+1 . . . ; it could also be the case that X aligns with Y, then X aligns with Y−1 . . . , so that the number Z of samples in the set 380 go "backwards" through the samples in the set 350.

As illustrated by reference 372, the output is Γ when d=D. Also, as illustrated by reference 373, the reflection coefficient Γ occurs looking outward from a beginning of the cable/connector system 310 toward the antenna 158.

In an example, the VSWR estimation control functionality 130 may cause the operations of the proposed method to occur. For instance, the signal(s) 381 may be used by the VSWR estimation control functionality 130 to load the correlator 370 with a selected delay, d, and to modify or cause to be modified the delay, d. As another example, the signal(s) 381 may be used by the VSWR estimation control functionality 130 to cause the sampling circuitry 340 to take the samples. In a further example, the sampling circuitry 340 is internally programmed to take the samples, where the sampling of reflected signal can occur at any time and the estimator block in block diagram in FIG. 5 will calculate the Return Loss. The signal(s) 381 is/are used to inform the VSWR estimation control functionality 130 (and/or the correlator 370) that the temporary buffers 155-1, 155-2 are full. In an additional example, the cross correlator 370 performs the cross correlations automatically and outputs the results 371 to the memory 155-3 and the signal(s) 381 are used to inform the VSWR estimation control functionality 130 as to the completion of all the correlations. Still other embodiments are possible, and the examples presented here should not be construed as being limiting.

FIG. 4 is a block diagram of an example of a logic flow diagram that illustrates the operation of an example of a method, a result of execution of computer program instructions embodied on a computer readable memory, and/or functions performed by logic implemented in hardware, in accordance with exemplary embodiments of this invention where each of the blocks in FIG. 4 a represent step in the method. The first step 402 is to measure values of a radio frequency signal that comprises a forward signal and a reflected version of the forward signal in a cable/connector system. Then as shown in block 404, input the measured values into a VSWR apparatus. Mathematically rotate in phase, in the VSWR apparatus, a complex form of a transmitted signal as shown in block 406. Sample a single axis of the transmitted signal as shown in block 408. Compare the sample against a single axis reflected signal as represented by block 410. Apply the rotation over equally spaced intervals spanning one complete cycle as represented by block 412. Take an absolute value of each return loss ratio as represented by block 414. Determine the mean of the absolute values as represented by block 416. And associate the mean value with a return loss of the cable/connector system as shown in block 418. Send the mean value from the VSWR apparatus to an alarm actuator and, in relation to a threshold, activate an alarm based on the mean value where these steps are represented by block 420. The method could also comprise determining an alarm should occur based on the return loss and/or outputting an indication of the alarm.

Figure 5:
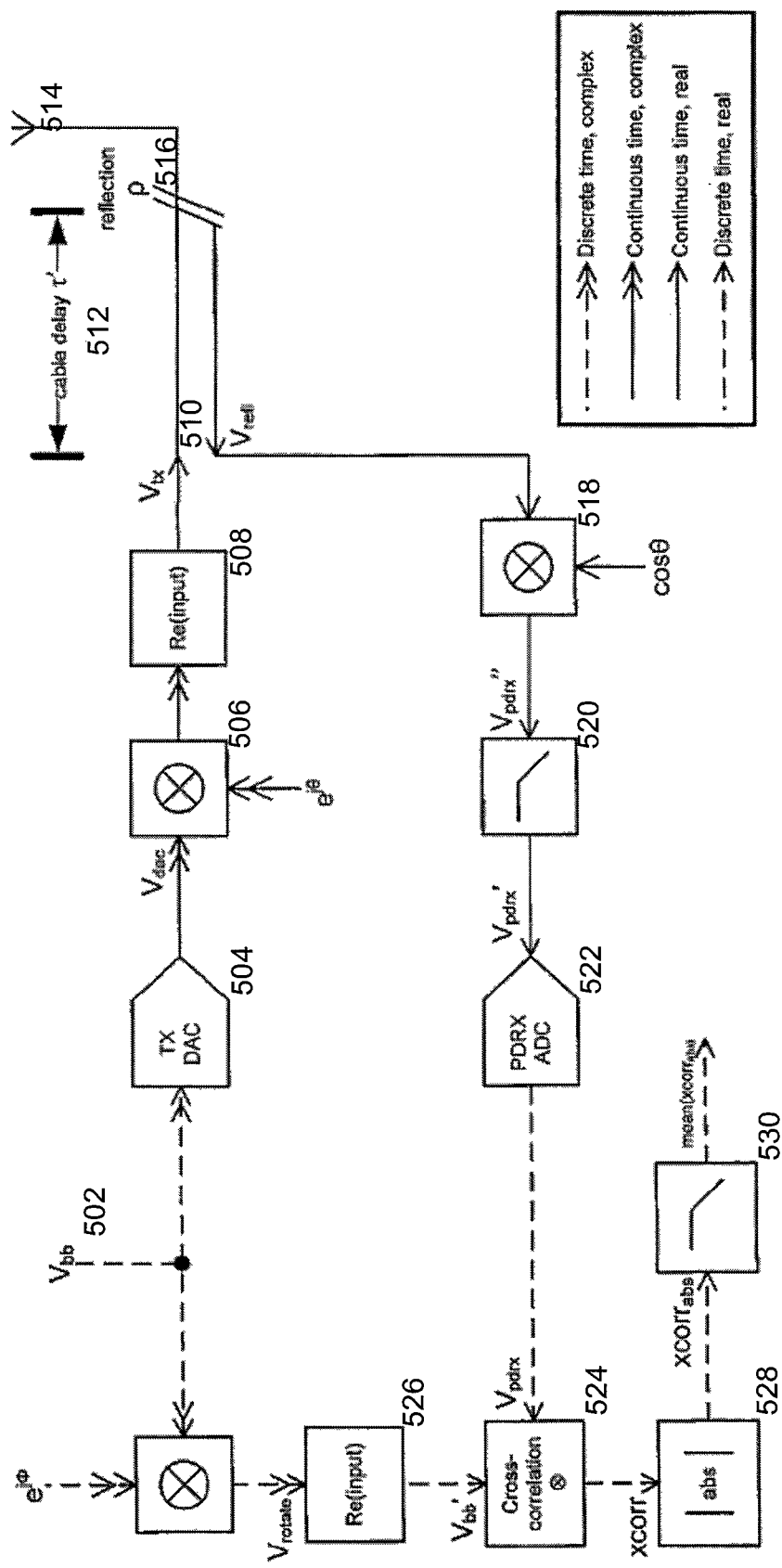
FIG. 5 is a block diagram of a radio transmitter and PDRX receiver model.

Turning to FIG. 5, a radio transmitter and PDRX receiver model, let Baseband (BB) signal 502 be denoted by, $$V_{bb}=S(kT)=I(kT)+jQ(kT) \quad (1)$$

This signal is converted to a continuous time signal by a DAC 504.

$$V_{dac}=I(t)+jQ(t) \quad (2)$$

A complex modulator 506 whose carrier frequency is $\omega_c$ then modulates the DAC output and the real part 508 of the modulator's output 510 is transmitted out of the radio.

$$V_{tx}=Re\{V_{dac} \cdot e^{j\omega_c t}\} \quad (3)$$

For mathematical convenience, equations (2) and (3), above, assume complex notation. In reality, the I(kT) and Q(kT) signals are converted to continuous time signals by independent DACs and then applied to a quadrature modulator. The quadrature modulator modulates (multiplies) the I(t) component by $\cos(\omega_c t)$ and the Q(t) component by $\sin(\omega_c t)$ and then combines their voltages. Let $\theta=\omega_c t$, so we have $$\begin{aligned} V_{tx} &= Re\{V_{dac} \cdot e^{j\theta}\} \\ &= Re\{[I(t)+jQ(t)] \cdot [\cos\theta + j\sin\theta]\} \\ &= I(t)\cos\theta - Q(t)\sin\theta \end{aligned} \quad (4)$$

The transmitted signal from the radio will travel along the cable (cable delay is τ' 512) that connects to the antenna 514 and be reflected back with a reflection coefficient 516 whose magnitude is ρ, i.e., reflected signal is given by, $$V_{refl} = \rho \cdot \{I(t-\tau')\cos\theta - Q(t-\tau')\sin\theta\} \quad (5)$$

Higher order terms 2θ contained in $V_{pdrx}''$ are rejected by the low pass filters 520 in the PDRX path and hence filtered PDRX output becomes $$V'_{pdrx} = \frac{\rho}{2} \cdot I(t-\tau) \quad (6)$$

Let $\frac{\rho}{2} = \rho'$, so that $$V_{pdrx}' = \rho' \cdot I(t-\tau) \quad (7)$$

Now, the signal is digitized by an ADC 522 and the resulting signal is given by, $$V_{pdrx} = V_{pdrx}'(kT) = \rho' \cdot I(kT-\tau) \quad (8)$$

If we knew what τ is, we can align $V_{pdrx}$ with $\text{Re}\{V_{bb}\}$ by delaying $\text{Re}\{V_{bb}\}$ by τ. Then, cross-correlation 524 of the aligned signal with $V_{pdrx}$ yields ρ, the magnitude of reflection coefficient after removing the other amplitude scaling factors.

To find τ, we can employ a delay search operation, which is essentially a time alignment procedure. But the problems with this process are two-fold: (1) the operation is complicated; and (2) the algorithm can easily be fooled by interference and/or noise combined with reflected signal.

A more robust solution that does not require strict time alignment or a priori knowledge of the phase is the subject of this invention. The procedure is as follows:

1. Rotate $V_{bb}$ by $\phi \in$ $$[\frac{-\pi}{2}, \frac{\pi}{2}]$$

and take the real part 526;

2. Cross-correlate the rotated signal for each $\phi \in$ $$[\frac{-\pi}{2}, \frac{\pi}{2}]$$

with $V_{pdrx}$ 524;

3. Take the absolute value of the result obtained in step 2 for each φ 528; and

4. Take the mean of all values (obtained for each φ) in step 3, to get ρ' scaled by $$\frac{2}{\pi} 530;$$

To better understand how this works, mathematical justification of this method is now presented. Consider that the rotation of $V_{bb}$ is mathematically given by, $$V_{rotate} = \{I(kT) + jQ(kT)\} \cdot e^{j\phi} \quad (9)$$
$$= \{I(kT) + jQ(kT)\} \cdot \{\cos\phi + j\sin\phi\}$$

Taking the real part of $V_{rotate}$ gives, $$V'_{bb} = \text{Re}\{V_{rotate}\} \quad (10)$$
$$= I(kT)\cos\phi - Q(kT)\sin\phi$$

Now, cross-correlate (denoted by ⊗) $V_{bb}'$ with $V_{pdrx}$ to give, $$\text{xcorr} = V'_{bb} \otimes V_{pdrx} \quad (11)$$
$$= \{I(kT)\cos\phi - Q(kT)\sin\phi\} \otimes \{\rho' \cdot I(kT-\tau)\}$$

Using distributive property of cross-correlation, we get, $$\text{xcorr} = \{I(kT)\cos\phi\} \otimes \{\rho' \cdot I(kT-\tau)\} - \{Q(kT)\sin\phi\}$$
$$\otimes \{\rho' \cdot I(kT-\tau)\} \quad (12)$$

Using associative property of cross-correlation with scalar multiplication, we get, $$\text{xcorr} = \rho' \cos\phi\{I(kT) \otimes I(kT-\tau)\} - \rho' \sin\phi\{Q(kT)$$
$$\otimes I(kT-\tau)\} \quad (13)$$

$\rho' \sin\phi\{Q(kT) \otimes I(kT-\tau)\} = 0$, because I & Q are random and uncorrelated (statistically independent). So, xcorr becomes $$\text{xcorr} = \rho' \cos\phi\{I(kT) \otimes I(kT-\tau)\} \quad (14)$$
$$= \rho' \cos\phi\{\delta[kT-\tau]\}$$

where δ is the Kronecker delta/unit impulse function.

Taking the absolute value of xcorr yields, $$\therefore \text{xcorr}_{abs} = |\rho' \cdot \cos\phi| \cdot |\delta[kT-\tau]| \quad (15)$$

Expanding unit impulse function gives, $$\text{xcorr}_{abs} = \begin{cases} 0, & kT \neq \tau \\ |\rho' \cdot \cos\phi|, & kT = \tau \end{cases} \quad (16)$$

Compute $\text{xcorr}_{abs}$ for each of a pre-determined range of values of $\phi \in$ $$[\frac{-\pi}{2}, \frac{\pi}{2}]$$

and find mean.

$$\therefore \text{mean}(\text{xcorr}_{abs}) = \text{mean}(|\rho' \cdot \cos\phi|) \quad (17)$$
$$= \rho' \cdot \text{mean}(|\cos\phi|)$$
$$= \rho' \cdot \frac{1}{\pi} \int_{-\pi/2}^{\pi/2} \cos\phi \cdot d\phi$$
$$= \frac{\rho'}{\pi} [\sin\phi]_{-\pi/2}^{\pi/2}$$
$$= \rho' \cdot \frac{2}{\pi}$$

Thus, the mean value will approach ρ' but scaled by $$\frac{2}{\pi}$$

which can be easily undone. Or, if a ratio is desired (for example, reflection coefficient), the factor $$\frac{2}{\pi}$$

will be eliminated if the forward signal is measured using the same method.

An advantage of the current invention is that the need for a generally complex and sometimes unreliable delay search algorithm is eliminated. Other advantages are that the overall method is easier to implement, takes less computation, and is generally more robust, especially in the presence of noise or interference than those methods used at the time of this invention. This invention will better address the interference limitations associated with the conventional (power meter based) methods. This method has been tested in the lab and its benefits confirmed therein.

Figure 6:
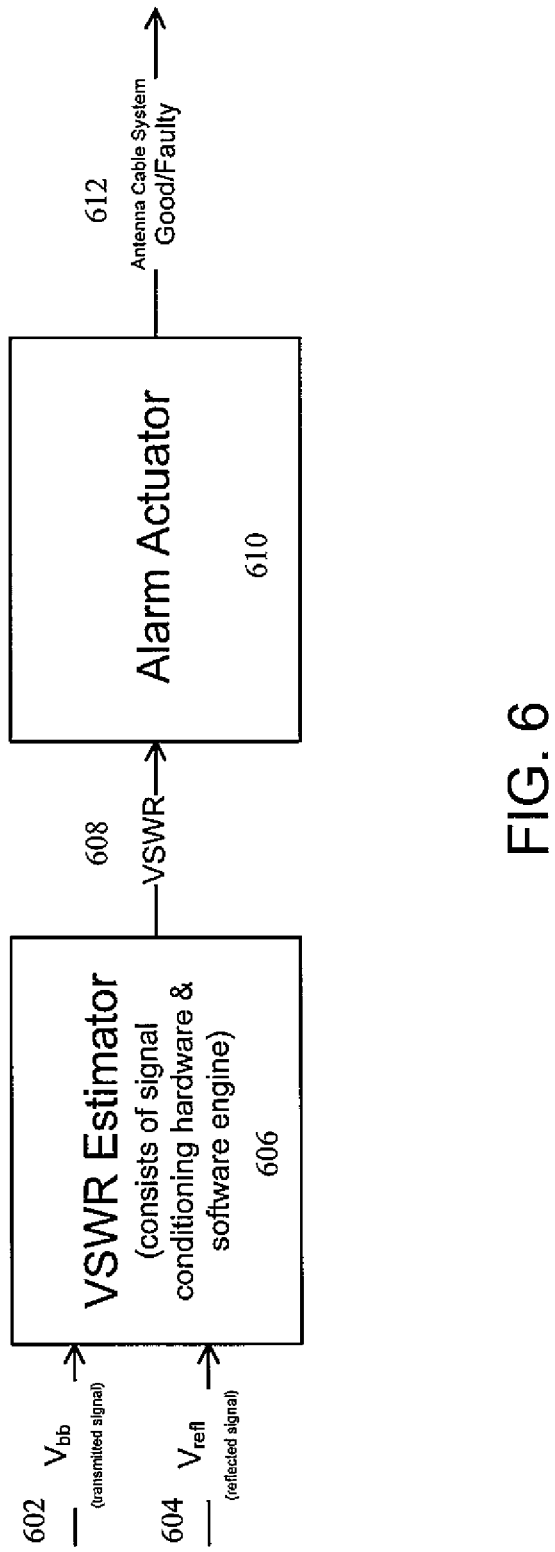
FIG. 6 is a block diagram representation of the physical inputs and physical outputs of an exemplary embodiment of the invention.

As a demonstration of the capabilities of an exemplary embodiment, consider the FIG. 6, which is a block diagram representation of the physical inputs and physical outputs of an exemplary embodiment of the invention. Both the transmitted signal 602 and the reflected signal 604 are entered into the VSWR Estimator 606, which consists of signal conditioning hardware and the software engine. Thereafter, the VSWR 608 enters an alarm actuator 610 with the resultant 612 of whether the antenna cable system cable system is good or faulty, wherein if it is good then the cable system can be used and if faulty than the cable system needs to be replaced.

Embodiments of the present invention may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium (e.g., memory(ies) 155 or other device) that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

An example of an embodiment, which can be referred to as item 1, is a method that comprises measuring values of a radio frequency signal that comprises: a forward signal and a reflected version of the forward signal in a cable/connector system; inputting the measured values into a VSWR apparatus; mathematically rotate in phase, in the VSWR apparatus, a complex form of a transmitted signal; sampling a single axis of the transmitted signal; comparing the sample against a single axis reflected signal; applying the rotation over equally spaced intervals spanning one complete cycle; taking an absolute value of each return loss ratio; determining the mean of the absolute values; associating the mean value with a return loss of the cable/connector system; and sending the mean value from the VSWR apparatus to an alarm actuator and activating the alarm based on the mean value in relation to a threshold.

An example of a further embodiment, which can be referred to as item 2, is the method of item 1 wherein the reflected radio frequency signal is a reflected version of a radio frequency version of the forward signal, wherein reflections occur at least by one or both of the cable/connector system or the one or more antennas.

An example of a further embodiment, which can be referred to as item 3, is the method of any one of items 1 or 2, wherein the rotation is at an interval of π/2.

An example of a further embodiment, which can be referred to as item 4, is the method of any one of items 1 to 3, wherein the forward signal and the reflected signal are measured by the same method.

An example of a further embodiment, which can be referred to as item 5, is the method of any one of items 1 to 4, wherein the maximum delay is determined at least by a value of twice an antenna cable length in the cable/connector system divided by a velocity of propagation of the forward radio frequency signal in the cable.

An example of a further embodiment, which can be referred to as item 6, is the method of any one of items 1 to 5, wherein the sampling is from baseband to one or more antennas a transmission path.

An example of a further embodiment, which can be referred to as item 7, is the method of any one of items 1 to 6, wherein the mean value is converted to a decibel value indicative of the return loss of the cable/connector system.

An example of a further embodiment, which can be referred to as item 8, is the method of any one of items 1 to 7, further comprising outputting an indication of the alarm.

An example of another embodiment, which can be referred to as item 9, is a computer program comprising program code for executing the method according to any of claims 1 to 8.

In another example of an embodiment of the current invention, which can be referred to item 20, a computer program product embodied on a non-transitory computer-readable medium in which a computer program is stored that, when being executed by a computer, would be configured to provide instructions to control or carry out any of the methods of claims 1 to 8.

An example of another embodiment of the present invention, which can be referred to as item 11, is an apparatus comprising at least one processor and at least one memory including computer program code, wherein the at least one memory and the computer code are configured, with the at least one processor, to cause the apparatus to at least perform the following: measuring values of a radio frequency signal that comprises a forward signal and a reflected version of the forward signal in a cable/connector system; inputting the measured values into a VSWR apparatus; mathematically rotate in phase, in the VSWR apparatus, a complex form of a transmitted signal; sampling a single axis of the transmitted signal; comparing the sample against a single axis reflected signal; applying the rotation over equally spaced intervals spanning one complete cycle; taking an absolute value of each return loss ratio; determining the mean of the absolute values; associating the mean value with a return loss of the cable/connector system; and sending the mean value from the VSWR apparatus to an alarm actuator and activating the alarm based on the mean value in relation to a threshold.

An example of a further embodiment, which can be referred to as item 12, is the apparatus of item 11, wherein the reflected radio frequency signal is a reflected version of a radio frequency version of the forward signal, wherein reflections occur at least by one or both of the cable/connector system or the one or more antennas.

An example of a further embodiment, which can be referred to as item 13, is the apparatus of any one of items 11 or 12, wherein the rotation is at an interval of $\pi/2$.

An example of a further embodiment, which can be referred to as item 14, is the apparatus of any one of items 11 to 13, wherein the forward signal and the reflected signal are measured by the same method.

An example of a further embodiment, which can be referred to as item 15, is the apparatus of any one of claims 11 to 14, wherein the maximum delay is determined at least by a value of twice an antenna cable length in the cable/connector system divided by a velocity of propagation of the forward radio frequency signal in the cable.

An example of a further embodiment, which can be referred to as item 16, is the apparatus of any one of items 11 to 15, wherein the sampling is from baseband to one or more antennas a transmission path.

An example of a further embodiment, which can be referred to as item 17, is the apparatus of any one of items 11 to 16, wherein the mean value is converted to a decibel value indicative of the return loss of the cable/connector system.

An example of a further embodiment, which can be referred to as item 18, is the apparatus of any one of items 11 to 17, wherein the at least one memory and the computer code are further configured, with the at least one processor, to cause the apparatus to at least further perform outputting an indication of the alarm.

In another example of an embodiment of the current invention, which can be referred to item 19, at least one integrated circuit comprising the apparatus of any one of claims 11 to 17.

In another example of an embodiment of the current invention, which can be referred to item 20, a base station comprising the apparatus of any one of claims 11 to 17.

An example of another embodiment of the present invention, which can be referred to as item 21, is an apparatus comprising means for measuring values of a radio frequency signal that comprises a forward signal and a reflected version of the forward signal in a cable/connector system; means for inputting the measured values into a VSWR; means for mathematically rotate in phase, in the VSWR, a complex form of a transmitted signal; means for sampling a single axis of the transmitted signal; means for comparing the sample against a single axis reflected signal; means for applying the rotation over equally spaced intervals spanning one complete cycle; means for taking an absolute value of each return loss ratio; means for determining the mean of the absolute values; means for associating the mean value with a return loss of the cable/connector system; and means for sending the mean value from the VSWR apparatus to an alarm actuator and activating the alarm based on the mean value in relation to a threshold.

An example of a further embodiment, which can be referred to as item 22, is the apparatus of item 21, wherein the reflected radio frequency signal is a reflected version of a radio frequency version of the forward signal, wherein reflections occur at least by one or both of the cable/connector system or the one or more antennas.

An example of a further embodiment, which can be referred to as item 23, is the apparatus of any one of items 21 or 22, wherein the rotation is at an interval of $\pi/2$.

An example of a further embodiment, which can be referred to as item 24, is the apparatus of any one of items 21 to 23, wherein the forward signal and the reflected signal are measured by the same method.

An example of a further embodiment, which can be referred to as item 25, is the apparatus of any one of claims 21 to 24, wherein the maximum delay is determined at least by a value of twice an antenna cable length in the cable/connector system divided by a velocity of propagation of the forward radio frequency signal in the cable.

An example of a further embodiment, which can be referred to as item 26, is the apparatus of any one of items 21 to 25, wherein the sampling is from baseband to one or more antennas a transmission path.

An example of a further embodiment, which can be referred to as item 27, is the apparatus of any one of items 21 to 26, wherein the mean value is converted to a decibel value indicative of the return loss of the cable/connector system.

An example of a further embodiment, which can be referred to as item 28, is the apparatus of any one of items 21 to 27, further comprising means for outputting an indication of the alarm.

In another example of an embodiment of the current invention, which can be referred to item 29, at least one integrated circuit comprising the apparatus of any one of claims 21 to 27.

In another example of an embodiment of the current invention, which can be referred to item 30, a base station comprising the apparatus of any one of claims 21 to 27.

It is also noted herein that while the above describes examples of embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:

ADC Analog-to-Digital Converter
ANT Antenna
ASIC Application-Specific Integrated Circuit
CDMA Code Division Multiple Access
CW Continuous Wave
DAC Digital-to-Analog Converter
dB decibel
dBc decibels relative to a carrier
DFT Discrete Fourier Transform
eNB evolved Node B (e.g., LTE base station)
FFT Fast-Fourier Transform
IC Integrated Circuit
LTE Long Term Evolution
Msps Megasamples per second
PA Power Amplifier
PDRX Predistortion Receiver
RF Radio Frequency
RFM Radio Frequency Module, e.g., a radio transceiver unit
RL Return Loss
Rx or RX Reception or Receiver
Tx or TX Transmission or Transmitter
TDR Time Domain Reflectometer VSWR Voltage Standing Wave Ratio
Xcorr( ) cross-correlation

What is claimed is:

1. A method, comprising:
measuring values of a radio frequency signal that comprises a forward signal and a reflected version of the forward signal in a cable/connector system;
inputting the measured values into a voltage standing wave ratio apparatus;
mathematically rotate in phase, in the voltage standing wave ratio apparatus, a complex form of a transmitted signal, where the rotation is applied over a plurality of equally spaced intervals;
sampling a single axis of the rotated complex form of the transmitted signal and comparing the sample against a single axis of a reflected radio frequency signal, wherein the sampling and the comparison is performed for the plurality of intervals;
taking an absolute value of each comparison to produce a set of absolute values for the plurality of intervals;
determining a mean value based on the set of absolute values;
associating the mean value with a return loss of the cable/connector system; and
sending the mean value from the voltage standing wave ratio apparatus to an alarm actuator and activating an alarm based on the mean value in relation to a threshold.

2. The method of claim 1, wherein the reflected radio frequency signal is a reflected version of a radio frequency version of the forward signal, wherein reflections occur at least from one or both of:
the cable/connector system, or
one or more antennas.

3. The method of claim 1, wherein the equally spaced intervals are of n/2.

4. The method of claim 1, wherein the forward signal and the reflected version of the forward signal are measured with a same method.

5. The method of claim 1, wherein a maximum delay is determined, where the determination comprises dividing a value of twice a length of an antenna cable in the cable/connector system over a velocity of propagation of the forward signal of the radio frequency signal in the antenna cable.

6. The method of claim 1, wherein the sampling is from a baseband to one or more antennas in a transmission path.

7. The method of claim 1, wherein the mean value is converted to a decibel value indicative of the return loss of the cable/connector system.

8. The method of claim 1, further comprising outputting an indication of the alarm, wherein the comparing of the sample against the single axis of the reflected radio frequency for the plurality of intervals produces a return loss ratio, and wherein the set of absolute values comprises a set of absolute values of the produced return loss ratios.

9. A computer program product embodied on a non-transitory computer-readable medium in which a computer program is stored that, when being executed with a computer, is configured to provide instructions to control or carry out the following:
measuring values of a radio frequency signal that comprises a forward signal and a reflected version of the forward signal in a cable/connector system;
inputting the measured values into a voltage standing wave ratio apparatus;
mathematically rotate in phase, in the voltage standing wave ratio apparatus, a complex form of a transmitted signal, where the rotation is applied over a plurality of equally spaced intervals;
sampling a single axis of the rotated complex form of the transmitted signal and comparing the sample against a single axis of a reflected radio frequency signal, wherein the sampling and the comparison is performed for the plurality of intervals;
taking an absolute value of each comparison to produce a set of absolute values for the plurality of intervals;
determining mean value based on the set of absolute values;
associating the mean value with a return loss of the cable/connector system; and
sending the mean value from the voltage standing wave ratio apparatus to an alarm actuator and activating an alarm based on the mean value in relation to a threshold.

10. An apparatus comprising at least one processor and at least one non-transitory memory including computer program code, wherein the at least one non-transitory memory and the computer code are configured, with the at least one processor, to cause the apparatus to at least perform the following:
measuring values of a radio frequency signal that comprises a forward signal and a reflected version of the forward signal in a cable/connector system;
inputting the measured values into a voltage standing wave ratio apparatus;
mathematically rotate in phase, in the voltage standing wave ratio apparatus, a complex form of a transmitted signal, where the rotation is applied over a plurality of equally spaced intervals;
sampling a single axis of the rotated complex form of the transmitted signal and comparing the sample against a single axis of a reflected radio frequency signal, wherein the sampling and the comparison is performed for the plurality of intervals;
taking an absolute value of each comparison to produce a set of absolute values for the plurality of intervals;
determining a mean value based on the set of absolute values;
associating the mean value with a return loss of the cable/connector system; and
sending the mean value from the voltage standing wave ratio apparatus to an alarm actuator and activating an alarm based on the mean value in relation to a threshold.

11. The apparatus of claim 10, wherein the reflected radio frequency signal is a reflected version of a radio frequency version of the forward signal, wherein reflections occur at least from one or both of:
the cable/connector system, or
one or more antennas.

12. The apparatus of claim 10, wherein the equally spaced intervals are of n/2.

13. The apparatus of claim 10, wherein the forward signal and the reflected version of the forward signal are measured with a same method.

14. The apparatus of claim 10, wherein a maximum delay is determined, where the determination comprises dividing a value of twice a length of an antenna cable in the cable/connector system over a velocity of propagation of the forward signal of the radio frequency signal in the antenna cable.

15. The apparatus of claim 10, wherein the sampling is from a baseband to one or more antennas in a transmission path.

16. The apparatus of claim 10, wherein the mean value is converted to a decibel value indicative of the return loss of the cable/connector system.

17. The apparatus of claim 10, wherein the at least one non-transitory memory and the computer code are configured, with the at least one processor, to cause the apparatus to at least further perform outputting an indication of the alarm.

18. At least one integrated circuit comprising the apparatus of claim 10.

19. A base station comprising the apparatus of claim 10.

20. The method of claim 1, wherein the comparing of the sample against the single axis of the reflected radio frequency signal comprises comparing the sample against a delayed version of the single axis of the reflected radio frequency signal.

* * * * *

UNITED STATES PATENT AND TRADEMARK OFFICE
CERTIFICATE OF CORRECTION

PATENT NO. : 10,859,615 B2
APPLICATION NO. : 15/135823
DATED : December 8, 2020
INVENTOR(S) : Darrell Barabash and Ramasamy Gopalan It is certified that error appears in the above-identified patent and that said Letters Patent is hereby corrected as shown below:

In the Claims

In Claim 3:
Column 19, Line 37, "n/2" should be deleted and --π/2-- should be inserted.

In Claim 12:
Column 20, Line 58, "n/2" should be deleted and --π/2-- should be inserted.

Signed and Sealed this
Nineteenth Day of January, 2021

Andrei Iancu
*Director of the United States Patent and Trademark Office*